United States Patent
Wang

(10) Patent No.: US 11,444,589 B2
(45) Date of Patent: Sep. 13, 2022

(54) BIAS CIRCUIT FOR A DOHERTY AMPLIFIER, AND A WIRELESS COMMUNICATION SYSTEM

(71) Applicant: Syntronic AB, Gävle (SE)

(72) Inventor: Zhancang Wang, Beijing (CN)

(73) Assignee: Syntronic AB, Gävle (SE)

( * ) Notice: Subject to any disclaimer, the term of this patent is extended or adjusted under 35 U.S.C. 154(b) by 0 days.

(21) Appl. No.: 17/316,926

(22) Filed: May 11, 2021

(65) Prior Publication Data

US 2021/0359652 A1 Nov. 18, 2021

(30) Foreign Application Priority Data

May 13, 2020 (SE) .................... 2050563-2

(51) Int. Cl.
*H03F 1/38* (2006.01)
*H03F 3/21* (2006.01)
(Continued)

(52) U.S. Cl.
CPC ........... *H03F 3/211* (2013.01); *H03F 1/0288* (2013.01); *H04B 1/38* (2013.01); *H04B 7/0413* (2013.01); *H03F 2200/451* (2013.01)

(58) Field of Classification Search
CPC .... H03F 2200/451; H03F 1/0288; H03F 1/56; H03F 3/211; H04B 7/0413; H04B 1/38
See application file for complete search history.

(56) References Cited

U.S. PATENT DOCUMENTS 9,071,202 B2 6/2015 Racey et al.
9,667,199 B1 * 5/2017 McLaren ................ H03F 3/195
(Continued)

FOREIGN PATENT DOCUMENTS

EP 3145077 3/2017
GB 2476388 6/2011

OTHER PUBLICATIONS

Zhancang Wang et.al, "Modern High Efficiency Amplifier Design:Envelope Tracking,Doherty and Outphasing Techniquies", Microwave Journal, vol. 57, No. 4, Apr. 2014, pp. 20-50; pp. 46-50; figures 22-23.

(Continued)

*Primary Examiner* — Rahel Guarino
(74) *Attorney, Agent, or Firm* — Renner, Otto, Boisselle & Sklar, LLP

(57) ABSTRACT

A bias circuit for a Doherty amplifier, characterized by comprising: an input port with an input impedance, wherein the input port is configured to receive a bias signal from a power supply; a first output port configured to provide a bias signal to an amplifier; a second output port configured to provide a bias signal to an amplifier; a two port impedance transformer with an input connected to the first input port, and an output of the two port impedance transformer having an intermediate impedance; an in-phase N-port dividing impedance transformer with an input connected to the output of the two port impedance transformer, wherein the in-phase N-port dividing impedance transformer comprises: a first output connected to the first output port having a first output impedance; and a second output connected to the second output port having a second output impedance.

8 Claims, 2 Drawing Sheets

(51) Int. Cl.
*H03F 1/02* (2006.01)
*H04B 1/38* (2015.01)
*H04B 7/0413* (2017.01)

(56) References Cited

U.S. PATENT DOCUMENTS

| | | |
|---|---|---|
| 9,893,687 B2 | 2/2018 | Lehtola |
| 2004/0222847 A1 | 11/2004 | Khanifar et al. |
| 2014/0120854 A1 | 5/2014 | Briffa et al. |
| 2016/0164466 A1 | 6/2016 | Briffa et al. |

OTHER PUBLICATIONS

Final Office Action and Swedish Search Report for corresponding Swedish Patent Application No. 2050563-2, dated Feb. 24, 2021.

* cited by examiner

BIAS CIRCUIT FOR A DOHERTY AMPLIFIER, AND A WIRELESS COMMUNICATION SYSTEM

This application claims priority of Swedish Application No. 2050563-2 filed May 13, 2020, which is hereby incorporated herein by reference.

TECHNICAL FIELD

The present invention relates to a bias circuit for a Doherty amplifier, and to a wireless communication system.

BACKGROUND

The Doherty amplifier is a very important amplifier design today and is used in many different applications. However, maybe the most important use is within mobile communication for amplification in the RF output stage. The basic idea of the Doherty amplifier is to combine a carrier amplifier with at least one peak amplifier, which is used for peak power. The Doherty amplifier power-combines two (and recently, more) amplifiers, one is called the "carrier" amplifier while the second is called the "peaking" amplifier. In many Doherty amplifiers the sub amplifiers are biased differently, the carrier amplifier is operating at a normal Class AB (provides gain at any power level) or Class B, while the peaking amplifiers are operating at Class C which only conducts at half of the cycle. The Doherty amplifier provides a number of beneficial properties, such as improved power-added efficiency, compared to a balanced amplifier, at backed off power levels.

The Doherty amplifier pair works as follows: On the input, the signal is split using a quadrature coupler, which may not necessarily be an equal split. The input behaves the same as a balanced amplifier, and has the same feature where mismatched amplifiers will have their reflection coefficients reduced if the reflection coefficients are equal in amplitude and phase; the reflected waves end up in the load terminating the isolated port of the coupler.

At the output of the Doherty pair, the two signals are out of phase by 90 degrees, but by the addition of a quarter-wave transmission line of the peaking amplifier, they are brought back into phase and reactively combined. At this point, the two signals in parallel create a Z0/2 impedance. This is stepped up to Z0 by a quarter-wave transformer. However, the amplifiers are operating non-linearly, which means that the output combiner becomes more complicated. During operation, the response of one amplifier actively load-pulls the other. In order to dimension and design a Doherty amplifier it is necessary to perform nonlinear analyses.

There are several ways to make the sub amplifiers behave differently. As previously mentioned, it is possible to set them in different bias classes. It is also possible to operate them in the same class, but use an adaptive biasing scheme to turn on the peaking amplifier when it is needed.

In modern mobile equipment, which utilizes the Doherty topography it, is of utmost importance to avoid crosstalk. Therefore, symmetry and isolation are of utmost importance. In particular, isolation becomes more important at higher frequencies, such as for example the frequencies used in 5G.

In D1 (U.S. Pat. No. 9,071,202B2) a Doherty amplifier with peak branch RF conditioning is disclosed. D1 has a main amplifier branch and one or more peak amplifier branches, where at least one peak amplifier branch has RF conditioning applied to its peak branch input signal such that the peak amplifier branch is active only when the peak branch input signal is greater than a specified threshold level. Depending on the implementation, the bias signal may be static or dynamic, and multiple peak amplifier branches may have diodes with independently or dependently generated bias signals. The solution according to D1 has at least the following problem: the use of separated gate biases for isolation requires a significant amount of the printed circuit board (PCB) area, which prevents miniaturization and low cost.

In D2 (U.S. Pat. No. 9,893,687B2) a solution for bias signal multiplexing is disclosed. D2 utilizes a large number of bias tee's and employs individual bias stages for the amplifiers of the Doherty topography. This solution with a rather complex biasing circuitry, which uses separated bias lines from the bias root. This also requires a significant amount of the PCB area, which results in problems with miniaturization and low cost.

Therefore, it remains a need to improve the miniaturization of the bias circuitry for Doherty amplifiers, and this is especially important in MIMO solutions of modern mobile equipment.

It is therefore an object of the present invention to present a bias circuit that allows a further miniaturization and cost reduction.

SUMMARY

According to the present invention, the above-mentioned object is achieved by means of a bias circuit having the features defined in claim 1.

The bias circuit for a Doherty amplifier according to the present invention comprises: an input port with an input impedance, wherein the input port is configured to receive a bias signal from a power supply; a first output port configured to provide a bias signal to an amplifier; a second output port configured to provide a bias signal to an amplifier; a two port impedance transformer with an input connected to the first input port, and an output of the two port impedance transformer having an intermediate impedance; an in-phase N-port dividing impedance transformer with an input connected to the output of the two port impedance transformer, wherein the in-phase N-port dividing impedance transformer comprises: a first output connected to the first output port having a first output impedance $Z1$; and a second output connected to the second output port having a second output impedance $Z2$.

According to one embodiment, the second output impedance $Z2$ is equal to the first output impedance $Z1$; the input impedance Zin is greater than the intermediate impedance Zm; and the first output impedance $Z1$ and the second output impedance $Z2$ are greater than the intermediate impedance Zm.

According to one embodiment, the in-phase N-port dividing impedance transformer comprises physical loads connected to the wave-guides thereof. This way the physical dimensions of the wave-guides may be reduced.

According to one embodiment, the physical loads are from the group of lumped elements, transmission line stubs, or hybrid devices.

According to one embodiment, the in-phase N-port dividing impedance transformer is a Wilkinson impedance transformer, or a Gysel impedance transformer.

According to one embodiment, the bias circuit is provided on a printed circuit board with micro strip waveguides, which forms the two-port impedance transformer and the in-phase N-port dividing transformer.

According to one embodiment, the in-phase N-port dividing impedance transformer further comprises N−2 outputs, wherein each one of the N−2 outputs is connected to a corresponding output port of the bias circuit, and wherein each of the corresponding output ports has an impedance ZN equal to the first and the second output impedance Z1, Z2.

The present invention also relates to a wireless communication system, comprising: a baseband processor; a DC power supply connected to the baseband processor; a power amplifier with multiple amplifying circuits, wherein the power amplifier comprises an input connected to the baseband processor; a bias circuit according to embodiments described herein, wherein the input port of the bias circuit is connected to the DC power supply, and the first output port, and the second output port of the bias circuit are connected to respective multiple amplifying circuits of the power amplifier; and a plurality of antennas are connected to outputs of the power amplifier.

Further advantages of the present invention will appear from the description following below.

LIST OF DRAWINGS

Embodiments of the invention will now be described in detail with regard to the annexed drawings, in which.

DETAILED DESCRIPTION OF EMBODIMENTS

Figure 1:
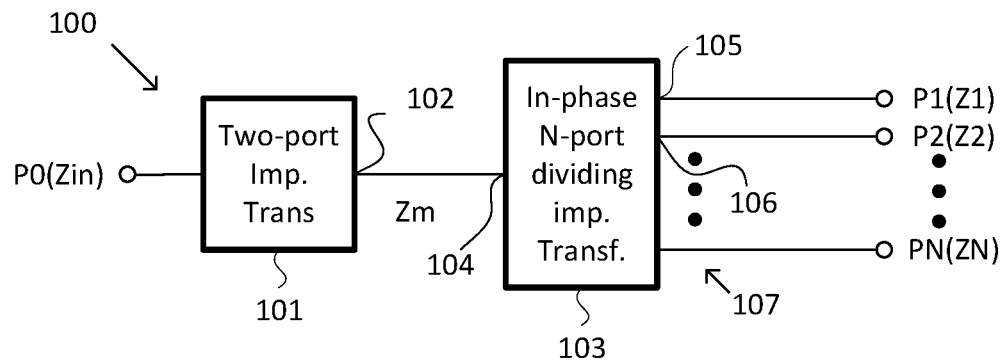
FIG. 1 is a block diagram of a bias circuit according to an embodiment of the present invention.
Figure 2:
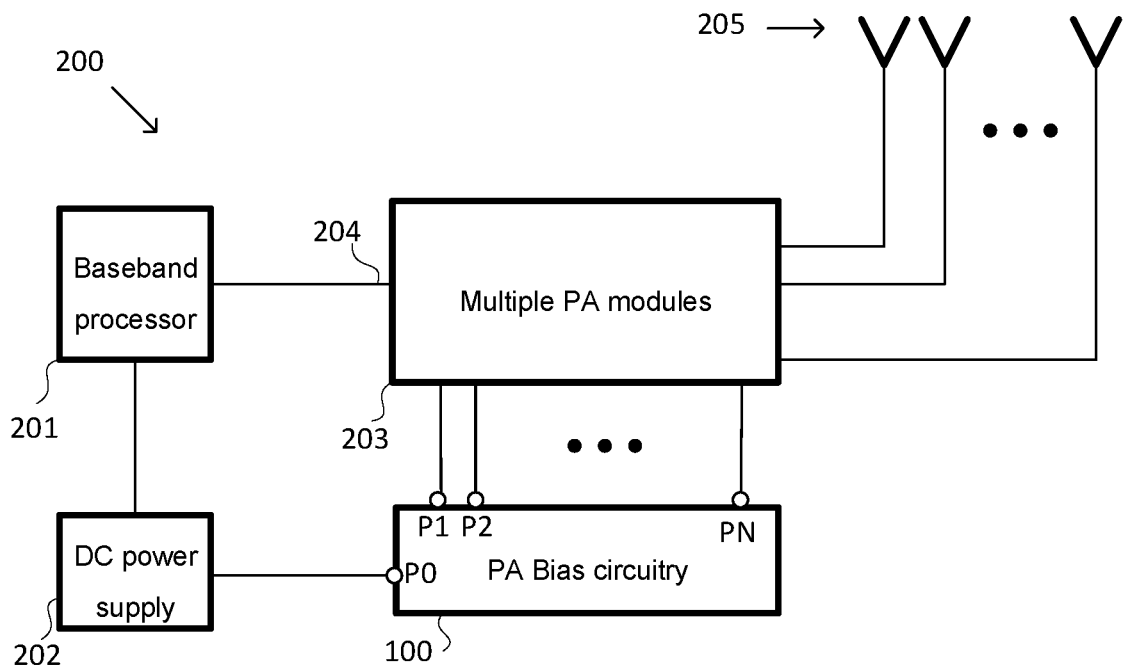
FIG. 2 is a block diagram of a wireless communication system according to an embodiment of the present invention.

Reference is made to FIG. 1 and FIG. 2, showing a bias circuit, generally designated 100 for a Doherty amplifier, comprising: an input port P0 with an input impedance Zin, wherein the input port is configured to receive a bias signal from a power supply 202; a first output port P1 configured to provide a bias signal to an amplifier 203; a second output port P2 configured to provide a bias signal to an amplifier 203; a two port impedance transformer 101 with an input connected to the first input port P0, and an output 102 of the two port impedance transformer 101 having an intermediate impedance Zm; an in-phase N-port dividing impedance transformer 103 with an input 104 connected to the output 102 of the two port impedance transformer 101, wherein the in-phase N-port dividing impedance transformer comprises: a first output 105 connected to the first output port P1 having a first output impedance Z1; and a second output 106 connected to the second output port P2 having a second output impedance Z2.

The second output impedance Z2 is equal to the first output impedance Z1; the input impedance Zin is greater than the intermediate impedance Zm; and the first output impedance Z1 and the second output impedance Z2 are greater than the intermediate impedance Zm.

The in-phase N-port dividing impedance transformer 103 comprises physical loads connected to the wave-guides thereof. This way the physical length of the fa wave-guides may be reduced, which is beneficial for miniaturization. The physical loads are from the group of lumped elements, transmission line stubs, or hybrid devices.

The in-phase N-port dividing impedance transformer (103) is a Wilkinson impedance transformer, or a Gysel impedance transformer.

The bias circuit is provided on a printed circuit board with micro strip waveguides, which forms the two-port impedance transformer and the in-phase N-port dividing transformer.

The in-phase N-port dividing impedance transformer further comprises N−2 outputs (107), wherein each one of the N−2 outputs is connected to a corresponding output port of the bias circuit, and wherein each of the corresponding output ports has an impedance ZN equal to the first and the second output impedance Z1, Z2.

FIG. 2 discloses a wireless communication system, generally designated 200, comprising: a baseband processor 201; a power supply 202 connected to the baseband processor; a power amplifier 203 with multiple amplifying circuits, wherein the power amplifier comprises an input 204 connected to the baseband processor; a bias circuit 100 according to embodiments described herein above, wherein the input port P0 of the bias circuit is connected to the DC power supply, and the first output port P1, and the second output port P2 of the bias circuit are connected to respective multiple amplifying circuits of the power amplifier; and a plurality of antennas 204 are connected to outputs of the power amplifier.

Figure 3:
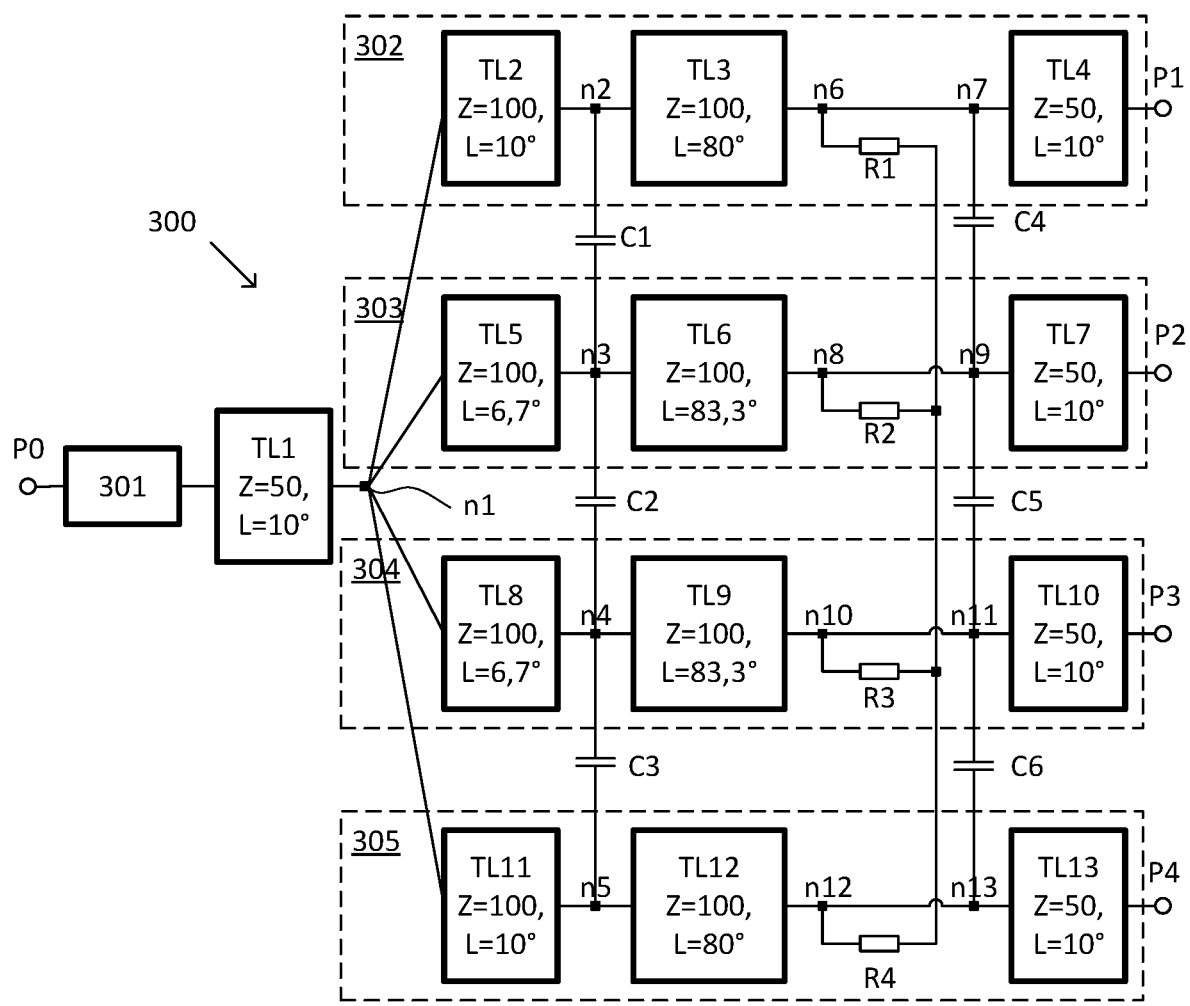
FIG. 3 is a block diagram of a bias circuit according to an embodiment with an N=4 in-phase SIMO impedance transformer with lumped element loads.

Now with reference made to FIG. 3 an embodiment of a bias circuit with a N=4 in-phase SIMO (Single Input Multiple Outputs) impedance transformer with lumped element loads, generally designated 300, according to the present invention will be presented. The bias circuit 300 comprises an input port P0 with an input impedance of 85 Ohm, the input port is configured to be connected to a power supply which supplies a bias signal to the input port P0. An input of an impedance transformer 301 is connected to the input port P0. The output of the impedance transformer is connected to first end of a first transmission line TL1 with an impedance of 50 Ohm and an electrical length of 10°, a second end of the first transmission line TL1 is connected to a distribution node n1, wherein the distribution node is connected to a first output node P1 via a first branch 302. The distribution node n1 is further connected to a second output node P2 via second branch 303. The distribution node n1 is further connected to a third output node P3 via a third branch 304. The distribution node n1 is further connected to a fourth output node P4 via a fourth branch 305. The distribution node n1 has an impedance Zm of 50 Ohm, whereas the output nodes P1 to P4 has an output impedance of 85 Ohm.

Now each branch will be described in detail in a direction from the distribution node to the corresponding output port P1-P4.

The first branch 302 comprises a first transmission line TL2 (100 Ohm, 10°) in one end connected to the distribution node n1 and in another end to a first end of a second transmission line TL3 (100 Ohm, 80°) via a first node n2, the second end of the second transmission line TL3 is further connected to a first end of a third transmission line TL4 (50 Ohm, 10°) via a second node n6 and a third node n7 connected in series, a second end of the third transmission line TL4 is connected to the first output port P1.

The second branch 303 comprises a first transmission line TL5 (100 Ohm, 6.667°) in one end connected to the distribution node n1 and in another end to a first end of a second transmission line TL6 (100 Ohm, 83.3°) via a first node n3, the second end of the second transmission line TL6 is further connected to a first end of a third transmission line TL7 (50

Ohm, 10°) via a second node n8 and a third node n9 connected in series, a second end of the third transmission line TL7 is connected to the second output port P2.

The third branch 304 comprises a first transmission line TL6 (100 Ohm, 6.667°) in one end connected to the distribution node n1 and in another end to a first end of a second transmission line TL9 (100 Ohm, 83.3°) via a first node n4, the second end of the second transmission line TL9 is further connected to a first end of a third transmission line TL10 (50 Ohm, 10°) via a second node n10 and a third node n11 connected in series, a second end of the third transmission line TL10 is connected to the third output port P3.

The fourth branch 304 comprises a first transmission line TL11 (100 Ohm, 10°) in one end connected to the distribution node n1 and in another end to a first end of a second transmission line TL12 (100 Ohm, 80°) via a first node n5, the second end of the second transmission fine TL12 is further connected to a first end of a third transmission line TL13 (50 Ohm, 10°) via a second node n12 and a third node n13 connected in series, a second end of the third transmission fine TL13 is connected to the fourth output port P4.

The bias circuit according to FIG. 3 further comprises a first capacitor C1 connected between the first node n2 of the first branch 302 and the first node n3 of the second branch 303. Further, the first node n3 of the second branch 303 is connected to the first node n4 of the third branch via a second capacitor C2. The first node n4 of the third branch is further connected to the first node n5 of the fourth branch via a third capacitor C3. The capacitors C1=C2=C3=1 pF in this embodiment.

The bias circuit 300 shown in FIG. 3 further comprises for each branch 302,303,304,305 a resistor R1,R2,R3 which in a first end is connected to the second node n6,n8,n9 of each branch, the second end of each resistor R1,R2,R3 are connected together.

Finally, the bias circuit according to FIG. 3 further comprises a fourth capacitor C4 connected between the third node n7 of the first branch 302 and the third node n9 of the second branch 303. Further, the third node n9 of the second branch 303 is connected to the third node n11 of the third branch via a fifth capacitor C5. The third node n11 of the third branch is further connected to the third node n13 of the fourth branch via a sixth capacitor C6. The capacitors C4=C5=C6=1 pF in this embodiment.

In further embodiments of FIG. 3 additional branches are easily added in a similar way but the length of the transmission lines must of course be found by means of electromagnetic simulations.

The invention claimed is:

1. A bias circuit for a Doherty amplifier, comprising:
an input port with an input impedance, wherein the input port is configured to receive a bias signal from a DC power supply;
a first output port configured to provide a bias signal to an amplifier;
a second output port configured to provide a bias signal to an amplifier;
a two port impedance transformer with an input connected to the input port, and an output of the two port impedance transformer having an intermediate impedance;
an in-phase N-port dividing impedance transformer with an input connected to the output of the two port impedance transformer, wherein the in-phase N-port dividing impedance transformer comprises:
a first output connected to the first output port having a first output impedance; and
a second output connected to the second output port having a second output impedance.

2. The bias circuit according to claim 1, wherein:
the second output impedance is equal to the first output impedance;
the input impedance is greater than the intermediate impedance; and
the first output impedance and the second output impedance are greater than the intermediate impedance.

3. The bias circuit according to claim 1, wherein the in-phase N-port dividing impedance transformer comprises physical loads connected to wave-guides thereof.

4. The bias circuit according to claim 3, wherein the physical loads are selected from lumped elements, transmission line stubs, or hybrid devices.

5. The bias circuit according to claim 1, wherein the in-phase N-port dividing impedance transformer is a Wilkinson impedance transformer, or a Gysel impedance transformer.

6. The bias circuit according to claim 1, wherein the bias circuit is provided on a printed circuit board with micro strip waveguides, which forms the two-port impedance transformer and the in-phase N-port dividing transformer.

7. The bias circuit according to claim 1, wherein the in-phase N-port dividing impedance transformer further comprises:
N−2 outputs, wherein each one of the N−2 outputs is connected to a corresponding output port of the bias circuit, and wherein each of the corresponding output ports has an impedance equal to the first and the second output impedance.

8. A wireless communication system, comprising:
a baseband processor;
a power supply connected to the baseband processor;
a power amplifier with multiple amplifying circuits, wherein the power amplifier comprises an input connected to the baseband processor;
the bias circuit according to claim 1, wherein the input port of the bias circuit is connected to the DC power supply, and the first output port, and the second output port of the bias circuit are connected to respective multiple amplifying circuits of the power amplifier; and
a plurality of antennas are connected to outputs of the power amplifier.

* * * * *